United States Patent [19]

Morcom et al.

[11] 3,979,237
[45] Sept. 7, 1976

[54] DEVICE ISOLATION IN INTEGRATED CIRCUITS

[75] Inventors: William R. Morcom, Indian Harbour Beach; Thomas J. Sanders, Indialantic, both of Fla.

[73] Assignee: Harris Corporation, Cleveland, Ohio

[22] Filed: Apr. 24, 1972

[21] Appl. No.: 246,982

[52] U.S. Cl. ............................. 156/3; 29/580; 148/187; 156/11; 156/13; 156/17; 357/50
[51] Int. Cl.² ........................ C23F 1/02; H01L 7/50
[58] Field of Search ............... 156/3, 8, 11, 16, 17, 156/6, 13, 605, 606; 29/580, 578; 148/175, 187; 317/234, 235; 357/48, 49, 50; 427/85, 86

[56] References Cited
UNITED STATES PATENTS

| | | | |
|---|---|---|---|
| 3,411,200 | 11/1968 | Formigoni | 29/580 |
| 3,433,686 | 3/1969 | Marinace | 156/17 X |
| 3,493,820 | 2/1970 | Rosvold | 156/17 X |
| 3,551,221 | 12/1970 | Yanagawa | 29/578 X |
| 3,559,283 | 2/1971 | Kravitz | 156/17 X |

*Primary Examiner*—William A. Powell
*Attorney, Agent, or Firm*—Leitner, Palan & Martin

[57] ABSTRACT

Isolation of device locations in a monolithic semiconductor integrated circuit is provided by depositing a thin film effective as a polishing stop on a planar surface of the semiconductor body in which the devices are to be fabricated, etching isolation grooves into the body through the thin film, coating the surfaces of the grooves and the film with an insulator layer, and growing polycrystalline material over the insulator layer to fill the grooves. The polycrystalline material in excess of that required to fill the grooves, and any insulator layer covering the planar surface of the thin film, are polished away without affecting the underlying planar surface of the semiconductor body, because the thin film is adapted to withstand polishing without damage. Finally, the thin film is stripped away leaving semiconductor islands having a planar surface and isolated by insulator layer-polycrystalline material filled moats. Devices are fabricated in these islands.

14 Claims, 6 Drawing Figures

DEVICE ISOLATION IN INTEGRATED CIRCUITS

BACKGROUND OF THE INVENTION

1. Field

The present invention resides in the field of semiconductor devices and processes for their production. In particular, the invention is directed toward the electrical isolation of semiconductor devices in a semiconductor substrate.

2. Prior Art

Typically, integrated circuits are fabricated as multiplicity of interconnected devices such as diodes, transistors and the like, within a monolithic body of semiconductor material. It is essential that the devices may be fabricated side-by-side within the substrate, and yet without the occurrence of any undesired interaction therebetween. To prevent unwanted interaction it is common practice to provide some form of electrical isolation barrier between the devices. Usually, the isolation is achieved by providing a diffused region between the devices as a PN junction which is readily reverse-biased to preclude current flow across the junction.

The prior art PN junction isolation technique has proved successful, but it has the distinct disadvantage of severely limiting the surface area of the semiconductor body (e.g., chip, slice, etc.) available for device fabrication. Specifically, as the isolation region diffuses into the semi-conductor body in a direction perpendicular to the surface it also spreads laterally (i.e., parallel to the surface) toward the devices which are to be isolated. In the case of transistor isolation, the diffused region must not come into actual contact with either transistor because that can lower the breakdown voltages and short circuit the bases. Accordingly, it is essential, where PN junction isolation is used, that sufficient space be provided between the devices to account for diffusion and depletion layer spreading. This space between devices is wasted area because it is useless for any other purpose.

Another prior art device isolation technique involves the deposition of a silicon nitride film on the semiconductor surface, the etching of grooves through the film and into the semiconductor body, followed by thermal growth of silicon dioxide to fill the grooves. The nitride retards the growth of the oxide other than in the grooves and is subsequently etched away to leave oxide isolated semiconductor islands with a planar surface. The technique has been dubbed "isoplanar". It suffers the disadvantage of being useful for only relatively shallow moats (e.g., about 1 micron) and hence limits the depth of isolation and of the island, thereby limiting the type of device which may be fabricated in the island. There is a critical time limitation on oxide growth before the nitride begins to break down and before any buried layer begins significant diffusion toward the planar surface, in subsequent processing. Further, the oxide thickness is limited by the magnitude of the temperature to which it must be subjected during subsequent processing.

SUMMARY OF THE INVENTION

It is a principal object of the present invention to provide an isolation technique and configuration which substantially increases the amount of surface area available for device fabrication in a given wafer size, to substantially increase the circuit yield per wafer and the number of devices per integrated circuit chip (die), without unduly restricting the type of devices (including both bipolar and MOS) which may be fabricated.

According to the invention, a thin film of a material capable of withstanding polishing is deposited on a planar surface of a semiconductor wafer in which integrated circuits are to be fabricated. The wafer may include a diffused buried layer and an epitaxial layer. A mask conforming to the desired isolation pattern is then provided over the exposed surface of the thin film, and isolation grooves (hereinafter sometimes referred to as "channels" or "moats") are etched through the film and into the semiconductor material. The grooves should be sufficiently deep to define the regions within which devices are to be fabricated. If the semiconductor body includes an epitaxial layer, the grooves should extend into the body to at least the depth of that layer. An insulator (e.g., dielectric) layer is then deposited or grown over the surfaces of the grooves.

The remaining portion of the grooves is then filled with pyrolytically deposited dielectric material or other fill material capable of withstanding subsequent high temperature processing, to the level of the original planar surface of the semiconductor body. It is because an exact fill is not practicable using conventional techniques, and because deposition of dielectric or other fill material will coat surfaces other than merely the grooves, that the thin film is employed. In particular, the grooves are readily overfilled, and the wafer is thereafter polished to remove excess fill material and to restore a planar surface. Since the thin film is capable of withstanding this polishing, it is effective as a "stop" to prevent damage to the underlying planar surface of the semiconductor material. After removal of the thin film by etching, the planar surface of the isolated semiconductor islands is exposed and normal integrated circuit processing may continue.

DETAILED DESCRIPTION

Figure 1:
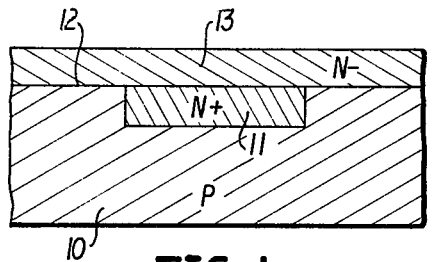
FIGS. 1–5 are fragmentary section views of a semiconductor body in which integrated circuit devices are to be fabricated, at various stages of isolation.

It is desired to provide suitable electrical isolation between devices in a semiconductor body 10 (FIG. 1). The body may, for example, be a P-type single crystal silicon slice. At specified locations therein, heavily doped N-type regions such as 11 may be diffused into major planar surface 12. After deposition of an epitaxial layer 13 on the surface 12, N+ region 11 constitutes a buried layer. By way of example, buried layer 11 may be from 2.0 to 4.0 microns deep (relative to surface 12) with a sheet resistance of approximately 125 ohms/-square, and epitaxial layer 13 (doped N⁻) may have a thickness in the range from 2.5 to 4.0 microns with a resistivity of appproximately 0.2 ohms-cm.

Figure 2:
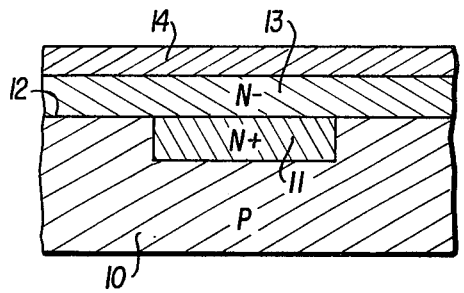

In accordance with one technique for performing the invention, a thin film 14 of sufficient hardness to withstand normal polishing of the slice is now deposited or otherwise formed on the exposed surface of epitaxial layer 13 (FIG. 2). The thin hard film may be composed of molybdenum, for example, deposited to a thickness of 1000 to 2000 angstroms (A). However, it will be appreciated that other materials of suitable hardness, such as silicon nitride ($Si_3N_4$) or aluminum oxide ($Al_2O_3$) may alternatively be employed for film 14. It is essential that the film be composed of a material which meets not only the hardness requirement but which is capable of withstanding processing temperatures up to about 1200°C.

Figure 3:
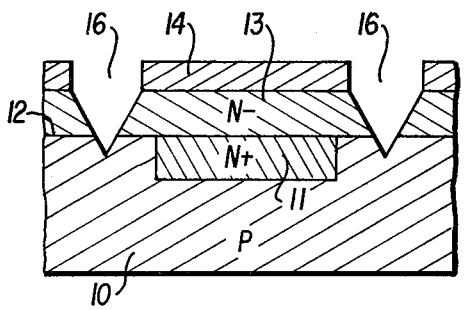

An isolation pattern is first defined in thin hard film 14 by a conventional photoresist operation. After the provision of openings in the film 14, isolation grooves 16 are etched into the semiconductor body 10. Where an epitaxial layer such as 13 has been deposited, the depth of grooves 16 should preferably exceed the thickness of that layer, as shown in FIG. 3. In contrast to the shallow groove limitations of isolation process practiced heretofore, the present invention is capable of providing groove depths of 25 microns or more.

Figure 4:
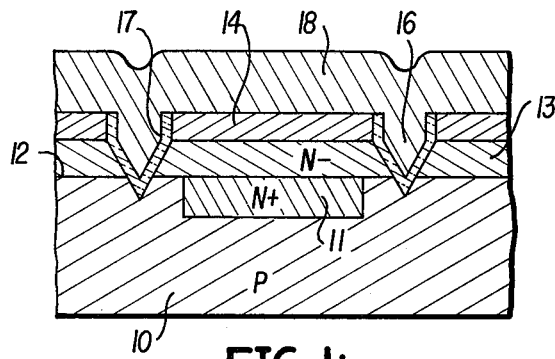

Thereafter, a thin insulator layer 17 (FIG. 4) is formed on the surface of the grooves 16. Preferably, this film is silicon dioxide ($SiO_2$), thermally grown to a thickness of about 12,000A. Thereafter, the remainder of each groove may be filled with any suitable material. It will be understood that the layer and film dimensions shown in the drawing are for the sake of clarity only and are not intended to designate relative or actual thicknesses of the layers and films. The grooves 16 constitute moats or channels between hard film-covered silicon islands in which devices for integrated circuits are to be fabricated. The oxide layer 17 electrically insulates the islands from one another and, in a preferred embodiment, also provides a growth sites for polycrystalline silicon 18 which is readily grown (by epitaxial deposition) to fill the moats and cover the islands. It is essential that the fill material, whatever it may be, is able to withstand subsequent high temperature processing and is adherent to the oxide layer to provide good integrity. While polycrystalline silicon is preferred for these reasons, pyrolytically deposited $SiO_2$ is a possible alternative.

Figure 5:
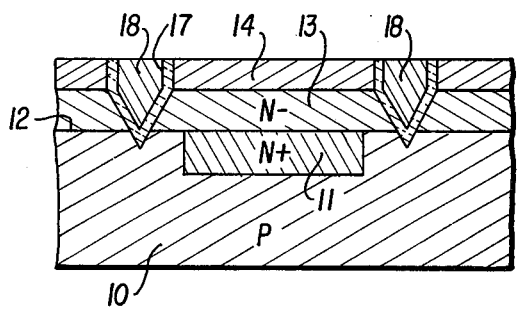

The excess polycrystalline silicon material 18, and any silicon dioxide layer 17 that may have been pyrolytically deposited, on the planar surface of thin hard film 14 is polished away by conventional machine polishing of the slice (FIG. 5), using a zirconium oxide abrasive, for example. The film 14 is sufficiently hard to act as a polishing stop and thereby assures that the polished surface conforms to the planar surface of the film. In addition, the film protects the underlying planar surface of the semiconductor islands of body 10 from any damage during the polishing process. Finally, film 14 is etched away to expose the planar surface of the islands. In the specific example of molybdenum as film 14, a suitable etchant for removal of the molybdenum without attacking the underlying silicon or significantly attacking the polycrystalline silicon and silicon dioxide in the moats is the well known molybdenum etch solution composed of phosphoric, nitric, and acetic acids. A silicon nitride film 14 is removable with concentrated phosphoric acid at about 180°C, or it may be left for use as a subsequent diffusion mask.

Figure 6:
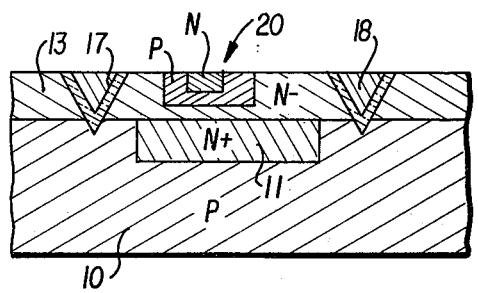
FIG. 6 is a fragmentary section view of the semiconductor body with a device fabricated in one of the islands.

After removal of the film, devices may be fabricated in the silicon islands to conform to a desired integrated circuit layout. One such device is a transistor 20 shown in cross-section in an isolated island in FIG. 6.

Rather than using a film which acts as a mechanical polish stop, it may be desirable to use a film which is effective as a chemical polish stop. A suitable material for the latter film is silicon dioxide. Initially a 2000 A thick layer of $SiO_2$ is thermally grown on the planar surface of the original silicon body. A photoresist operation is used to define the isolation regions where moat etching is to be performed. As in the previously described examples, the moat depth should exceed the thickness of the epitaxial layer. The mask oxide ($SiO_2$) is then stripped away and a new silicon dioxide film, to be used as the polish-resistant film 14 and as the isolation layer 17, is grown to a thickness of 6000 A. The polycrystalline silicon filler is then deposited atop the $SiO_2$ to fill the grooves (while simultaneously covering the islands). The polycrystalline is then removed by chemical polishing using a cupric ion solution, rather than by mechanical polishing using abrasives. The same polishing apparatus is used. The cupric ion solution does not chemically attack the $SiO_2$ film 14 as it does the excess polycrystalline silicon 18. Hence, film 14 is effective as a polishing stop (albeit chemical rather than mechanical) here also.

An alternative film for use as a chemical polish stop is silicon nitride. The same etchant as above, cupric ion solution, is used during polishing.

In addition to the advantages previously mentioned, the present invention assures that the epitaxial layer thickness is not a critical parameter conditioned on limitations of the groove depth. Furthermore, the invention assures that the moat fill step is not critical or difficult, because any irregularities in the fill are smoothed during the polishing step.

We claim:
1. A method of isolating circuit devices in a semiconductor body having first and second substantially parallel major planar surfaces and having at least two contiguous layers of distinct and different conductivity type the major portion of whose boundary lies substantially parallel to said planar surfaces, which comprises
    adherently forming on said first planar surface of said semiconductor body a thin film of polish-resistant material,
    etching grooves penetrating substantially normal to said first planar surface through said film and to a depth exceeding the depth of said boundary but short of said second planar surface of said semiconductor body, to define portions of said body encompassed by said grooves and in which circuit devices are to be fabricated,
    thermally growing an oxide isolation layer on exposed surfaces of said grooves, of insufficient thickness to fill said grooves,
    depositing polycrystalline film material on said oxide isolation layer in said grooves in sufficient quantity to fill the remainder of the grooves and overlie said thin film of polish-resistant material,
    polishing away the polycrystalline material in excess of that required to fill said grooves until said thin film is encountered to retard further removal and to prevent damage to said first planar surface of said semiconductor body, and
    fabricating circuit devices in said body adjacent said first planar surface thereof while leaving the portion of said body unpenetrated by said grooves intact to constitute a rigid support for said devices and to provide junction isolation between said two contiguous layers, with lateral isolation between devices within body portions encompassed by said grooves provided by said oxide isolation layer.
2. The method of claim 1, including the step of etching away the polish-resistant film to expose said first planar surface prior to fabricating circuit devices therein.

3. The method of claim 1, wherein
said semiconductor body is single crystal silicon, said isolation layer is silicon dioxide, and said polycrystalline material is polycrystalline silicon.

4. The method of claim 1, wherein
said thin film is composed of molybdenum.

5. The method of claim 1, wherein
said thin film is composed of silicon nitride.

6. The method of claim 1, wherein
said thin film is composed of silicon dioxide.

7. The method of claim 1, wherein an epitaxial layer of doped semiconductor material is deposited to form said first planar surface and the first of said two contiguous layers of said semiconductor body.

8. A method of isolating circuit devices in a semiconductor body, comprising
forming first and second contiguous layers of different conductivity type with a P-N junction therebetween in said body,
providing an adherent layer of polish-resistant material on a planar surface of said body,
etching grooves through said polish-resistant layer and partly penetrating said body to a depth exceeding the depth of said P-N junction,
forming a dielectric isolation layer on the exposed surfaces of said grooves,
overfilling the remainder of the grooves with adherent, high temperature-resistant material,
polishing away the fill material in excess of that required to fill the grooves, said polish-resistant layer acting as a polishing stop to prevent damage to the underlying planar surface of the body portions between said grooves,
said dielectric layer-coated grooves providing dielectric isolation and said P-N junction permitting junction isolation of circuit devices to be fabricated in said body portions between said grooves.

9. The method of claim 8, further including
stripping away the polish-resistant layer to expose said planar surface of the body portions.

10. The method of claim 8, further including
fabricating circuit devices in said body portions.

11. The method of claim 8, wherein
said semiconductor body is single crystal silicon, and said dielectric isolation layer is thermally grown silicon dioxide.

12. The method of claim 11, wherein
said fill material is pyrolytically deposited silicon dioxide.

13. The method of claim 11, wherein
said fill material is polycrystalline silicon.

14. A process for fabricating integrated circuits with combined dielectric isolation and junction isolation of circuit elements, which comprises
providing an adherent layer of polish-resistant material on a major planar surface of a single crystal semiconductor body;
forming moats through said polish-resistant layer and said semiconductor body to a depth exceeding the depth of the P-N junction between opposite conductivity layers of said body but short of severing the body,
coating the surfaces of the moats with a film of dielectric material,
filling the remaining moat space with polycrystalline material,
polishing away any excess polycrystalline material to form a smooth planar surface, said polish-resistant layer acting as a polishing stop to prevent damage to the underlying planar surface of said body, and
fabricating circuit elements in the portions of the semiconductor body between the grooves and whereby lateral isolation of the elements is provided by the dielectric-coated grooves and vertical isolation is provided by said P-N junction.

* * * * *